United States Patent
Mimura et al.

(12) 
(10) Patent No.: US 6,819,349 B2
(45) Date of Patent: Nov. 16, 2004

(54) MARK FORMING METHOD AND PRODUCT USING THE SAME METHOD

(75) Inventors: Masaaki Mimura, Fukuoka (JP); Mitsuo Imamoto, Fukuoka (JP); Masashi Kawamoto, Fukuoka (JP)

(73) Assignee: Toto Ltd., Fukuoka (JP)

( * ) Notice: Subject to any disclaimer, the term of this patent is extended or adjusted under 35 U.S.C. 154(b) by 81 days.

(21) Appl. No.: 09/987,380

(22) Filed: Nov. 14, 2001

(65) Prior Publication Data

US 2002/0097279 A1 Jul. 25, 2002

(30) Foreign Application Priority Data

Nov. 14, 2000 (JP) ........................................ 2000-346473
Nov. 14, 2000 (JP) ........................................ 2000-346474
Mar. 28, 2001 (JP) ........................................ 2001-093156

(51) Int. Cl.[7] ............................ B41J 2/435; C25D 5/02
(52) U.S. Cl. ........................................ 347/224; 205/120
(58) Field of Search ........................... 347/224, 230; 204/478; 205/118, 120; 206/459.5; 216/65, 72; 257/797

(56) References Cited

U.S. PATENT DOCUMENTS 4,400,252 A * 8/1983 Ushijima .................... 204/478
5,006,207 A * 4/1991 Peterman et al. ........... 205/120
5,104,480 A * 4/1992 Wojnarowski et al. ........ 216/65
6,400,037 B1 * 6/2002 Omizo ........................ 257/797
2001/0054564 A1 * 12/2001 Bethune et al. .......... 206/459.5

FOREIGN PATENT DOCUMENTS

JP  64-58540   * 3/1989  ........... B32B/15/08
JP  4-218683   * 8/1992  ........... C23C/28/00
JP  8/283962     10/1996

* cited by examiner

*Primary Examiner*—Hai Pham
(74) *Attorney, Agent, or Firm*—Michael D. Bednarek; Shaw Pittman LLP

(57) ABSTRACT

According to the present invention, there is provided a method for forming a mark having superior conspicuity, wherein plural plating layers each having a different hue are formed on a base, a portion of the upper plating layer is removed by laser marking so as to reveal the color of the lower plating layer, and thereby the color difference between a mark and the upper plating layer is made clear. Further, after the upper plating layer is removed by laser marking, another plating layer may be applied to a mark portion to make the mark conspicuous. Furthermore, a concave portion or concavo-convex portions may be provided on the surface of the plating layers, and the concave portion or concavo-convex portions may be colored with ink or paint. With these methods, it is possible to easily form a colored mark having superior conspicuity, corrosion resistance, adhesion, abrasion resistance and to produce a product bearing such a mark.

5 Claims, 2 Drawing Sheets

MARK FORMING METHOD AND PRODUCT USING THE SAME METHOD

BACKGROUND OF THE INVENTION

1. Field of the Invention

The present invention relates to a method for applying text a picture or the like onto the surface, of plural plating layers or onto the surface of a vacuum plating layer formed an the plural plating layers using laser processing to form a mark (hereinafter, referred to as "laser marking"), a method for applying another plating layer to a mark portion or coloring a mark portion with ink paint, or the like, and a product using these methods. The product refers to a faucet appliance which is attached to a water-supplied area of a toilet room, a washing room, a bathroom, a kitchen, and to other equipment including a faucet or fixtures for water supply or drainage, fixtures for sanitary ware, accessories, a handrail, and other peripheral apparatus.

2. Description of the Prior Art

Mark forming methods for displaying the name of a manufacturer, text, a picture or the like by forming a plating layer on the surface of a metal or resin product have been implemented in various fields. According to a general example on conventional arts, irregularities are formed on the surface of a base by hammering, carving, etching, laser marking or the like, and thereafter a plating layer is applied, so that the differences in brightness among the irregularities on the surface of the plating layer makes the mark distinguishable. There is another example in which a plating layer is applied, and thereafter hammering, etching, laser marking or the like is conducted.

Also, mark forming methods for coloring and displaying the name of a manufacturer, text, a picture or the like on the surface of a metal or resin product or on the surface of a plating layer formed thereon have been implemented in various fields. According to a general example among conventional arts, there is a method for forming a mark by directly printing to the surface of a base or the surface of a plating layer formed thereon, a method in which a concave portion is formed on the surface by cutting, carving, etching or the like, and a method in which a concave portion is formed on the surface and ink, paint, or the like is poured into the concave portion.

In addition, as a method using laser marking, there is a method in which a thin film is formed on the surface of a metal base by ion plating, the surface of the base is exposed by laser marking, and thereafter a gold plating layer is applied a method in which a masking layer is formed on the surface of a metal base, the surface of the base is exposed by laser marking, and thereafter ion plating is conducted. Such a method is disclosed in Japanese Unexamined Patent Application Publication No. 8-283962, or the like. Another method is known for forming a mark by attaching a printed seal or the like.

Drawbacks of the conventional method in which hammering, caving etching, laser marking or the like is conducted before plating, the mark is distinguished only by the brightness differences on the plating-conducted surface, the plating layer makes narrow and shallow lines vague and the mark is hard to see. Therefore, it is difficult to obtain a conspicuous mark.

Drawback of the conventional method in which hammering is conducted after plating also include the drawback that the mark is hard to see and also the plating layer in the hammered portion is subject to cracking and corrosion. Drawbacks of the conventional method in which etching is conducted after plating include the drawback that narrow lines cannot be drawn and also that the etched portion is subject to corrosion and discoloration. According to the conventional method in which laser marking is conducted after plating, narrow and clear lines can be drawn, however, corrosion will result if the processing depth reaches the base.

Drawbacks of the conventional method for forming a mark by directly printing to the surface of a base or the surface of a plating layer formed thereon, since there are cases where the adhesion is stall and the thickness of the printing is small depending on the kind of a base, include the drawback that the mark is subject to peeling or wear because of friction or abrasion so as to become indistinguishable in particular, since the adhesion is very small and the frequency of maintenance is high, in a case of printing to a plated product the mark becomes indistinguishable as the product is used. Also, attaching a printed seal causes the same problem as the case of printing.

According to the conventional method in which a concave portion is formed on the surface by cutting, carving, etching, molding or the like, and ink, paint or the like is poured into the concave portion, since the ink or the like is embedded into the concave portion, the adhesion and the abrasion resistance are improved. However, elaborate work is required to keep the ink or the like confined to the concave portion. Further, the processing cost becomes higher because it is necessary to increase the processing depth of the concave portion and to wipe or grind the surface after the ink or the like is poured. Also, since the size of the processing tool is limited in the case of cutting, carving or molding and a mark is formed by corrosion in the case of etching, it is difficult to form narrow and clear lines in either case.

Drawbacks of the conventional method in which a thin film is formed on the surface of a metal base by ion plating, the surface of the base is exposed by laser marking, and thereafter a gold plating layer is applied include the drawback that the variation of the color is limited. Drawbacks of the conventional method in which a masking layer is formed on the surface of a metal base, the surface of the base is exposed by laser marking, and thereafter ion plating is conducted include the drawback that the processing cost is high.

Drawbacks of the conventional method in which hammering, carving, etching or the like is conducted to a plated product also include the drawback that only a simple letter or picture an be formed and the mark is not conspicuous for its appearance.

Drawbacks of the conventional method for forming a mark by directly printing to the surface of a base or the surface of the plated base, or the conventional method in which a printed seal is attached also include the drawback that the use of these methods is limited to only a certain area where the adhesion or the abrasion resistance is not required so much. The conventional method by hammering, carving etching, molding, or the like has a limitation that it is applied only to a case of a simple letter or picture from the viewpoint of the cost.

In order to solve the above-mentioned problems, the present invention provides a method for easily forming a colored display having superior conspicuity, corrosion resistance, adhesion and abrasion resistance and a product treated according to method by conducting laser marking to the surface of a plating layer, then applying another plating layer to the surface of the plating layers to which laser marking is conducted or applying ink or paint to the surface of the plating layers to which laser marking is conducted.

SUMMARY OF THE INVENTION

According to the first aspect of the present invention, there is provided a method for forming a mark having superior conspicuity, wherein plural plating layers each having a different hue are formed on a base, the upper plating layer is removed by laser marking so as to reveal the color of the underlying plating layer, and thereby the color difference between a mark and the upper plating layer is made clear. With this methods it is possible to color a mark, and also form fine and narrow lines by laser marking, whereby conspicuity and the superiority in design of a mark to be used can be greatly improved.

According to the second aspect of the present invention, there is provided a method for forming a mark, wherein plural plating layers formed on a base are comprised of the combination of a nickel plating layer and a chromium plating layer formed thereon. The combination of the yellowish and bright color of the nickel plating layer and the bluish and bright color of the chromium plating layer makes the mark conspicuous. Also, in order to obtain corrosion resistance of the mark, the nickel plating layer has a thickness of 5 $\mu$m or more, and the depth of the laser marking processing is targeted for around 2 to 3 $\mu$m. The allowable error in the depth of the processing is limited to an extent within the thickness of the nickel plating layer.

According to the third aspect of the present invention, there is provided a method for forming a mark, wherein a vacuum plating layer of titanium nitride or zirconium nitride is formed on the plural plating layers by a PVD method. It is possible to obtain various colors including gold, brown, or gray as the color of the surface layer, and to obtain a mark having superior conspicuity by varying the combination of the surface color and the nickel color in tho mark.

According to the fourth aspect of the present invention, in the method for forming a mark according to the second or third aspect of the present invention, another material is used for each plating layer, and the combination of the surface layer color and the mark nickel color can freely be varied.

According to the fifth aspect of the present invention, there is provided a method for forming a mark, wherein plural plating layers are formed on a base, the is upper plating layer is removed by laser marking, and another plating layer is applied to a mark portion. The color difference between the mark and the upper plating layer enables the mark to have superior conspicuity. With this method, it is possible to color a mark and also to create fine and narrow lines by means of the laser marking, so as to greatly improve the conspicuity and the design.

According to the sixth aspect of the present invention, there is provided a method for forming a mark, wherein plural plating layers formed on a base are constructed of the combination of a nickel plating layer and a chromium plating layer formed thereon, and another plating layer is applied to a mark portion so as to make the mark conspicuous. If another plating layer is applied to the upper plating layer made of chromium, the adhesion is insufficient and the plating layer applied to the upper layer can be easily removed by wiping with a hand or polishing with airplane cloth. On the other hand, with this method, since another plating layer is applied to the nickel plating layer which forms the surface of the mark, the adhesion is sufficient and the plating cannot be removed. Also, in order to obtain corrosion resistance of the mark, the nickel plating layer has a thickness of 5 $\mu$m or more, and the depth of the laser marking processing is targeted for around 2 to 3 $\mu$m. The depth variance of the processing is limited to an extent within the thickness of the nickel plating layer.

According to the seventh aspect of the present invention, in the method for forming a mark according to the sixth aspect of the present invention, the kind of the plating layer applied to the mark portion is varied, and thereby the color of the mark portion can freely be varied.

According to the eighth aspect of the present invention, there is provided a method for forming a mark, wherein plating layers are formed on a base, a concave portion or concavo-convex portions is provided on the surface of the plating layers, and the concave portion or concavo-convex portions is colored with ink or paint. With this method, it is possible to display fine and narrow lines, so as to greatly improve the conspicuity and the design. Also, since the surface to which laser marking is conducted is rough, the contact area with the ink or paint is increased and an anchoring effect is obtained. As a result, the adhesion to ink or paint and the abrasion resistance is greatly improved. Also, even if the color of the mark has gone the mark formed by laser marking is still left. There is no likelihood that the mark may completely disappear.

According to the ninth aspect of the present invention, there is provided a method for forming a mark, wherein plating layers are formed on a base, a mask is formed on the surface of the plating layers, laser marking is conducted to the surface of the plating layers together with the mask, and thereby a colored mark can be obtained without bleeding of ink or paint. With this method, it is possible to save the trouble of setting the position of coloring and prevent the problem of dislocation. The mask is removed after the coloring, the adhesion of ink or paint to the mask is not a problem. It is possible to widely select a method of coloring, and thereby the workability is greatly improved and the cost is reduced.

According to the tenth aspect of the present invention, in the method for forming a mark according to the ninth aspect of the present invention, the combination of the depth of laser processing and the thickness of the mask is varied, and thereby the thickness of the coloring can be selected depending on the object or use. With this method, it is possible to improve the quality and variation of the mark.

According to the eleventh aspect of the present invention, in the method for forming a mark according to the tenth aspect of the present invention, the masking method can be changed in the case where the mask material is resin. It is possible to select applying or printing resist ink or paint. As a result, it is possible to change the thickness of the mask depending on the object or use, and thereby the variation of the mark can be increased.

According to the twelfth or thirteenth aspects of the present invention, in the method for forming a mark according to the eighth or ninth aspect of the present invention, the coloring method can be selected depending on the depth of laser processing and the thickness of the mask, and thereby the best coloring method can be selected depending on the object or use.

According to the fourteenth aspect of the present invention, there is provided a faucet product on which a colored mark having a desired text or picture is formed by the method for forming a mark according to any one of the first to thirteenth aspects of the present invention.

DETAILED DESCRIPTION OF THE PREFERRED EMBODIMENTS

Figure 1:
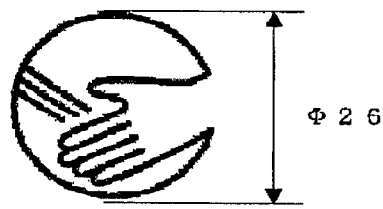
FIG. 1 is a view of the design of a mark according to the embodiments of the present invention.

Metal such as a copper alloy, stainless steel, zinc diecasting or the like, or resin such as ABS, polyacetals, polycarbonate or the like is used for the material of a faucet product. As a surface treating method for a faucet product, it is possible to conduct polishing or airplane cloth processing to the body of the product, wet plating of nickel and chromium or gold, dry plating by ion plating of TiN, ZrN or the like, or painting of epoxy or polyester.

As a surface treating method for metal fixings of a faucet product, nickel-chromium plating is generally used, and the thickness of the plating is set taking corrosion resistance and abrasion resistance into consideration. In a case where the base is a copper alloy, the thickness of a nickel plating layer is generally 2 μm or more and the thickness of a chromium plating layer is generally 0.1 μm or more.

According to the present invention, the kind, the combination, and the thickness of plating layers is selected taking the conspicuity and corrosion resistance of a mark into consideration. A mark is formed on the surface of the plating layers by controlling the depth of laser markings.

In the case of plural plating layers which are comprised of a nickel plating layer and a chromium plating layer formed thereon, the color of a mark portion obtained by laser marking can be varied by selecting nickel (yellowish and bright color), black nickel (black and bright color), or an alloy of tin and nickel (purplish and bright color) as the kind of the nickel plating layer. In addition, a color difference between the surface and the mark is obtained by selecting chromium (bluish and bright color), black chromium (black and bright color), an alloy of tin and cobalt (blackish and bright color), or gold (gold and bright color) as the kind of the chromium plating layer. Other kinds of the plating layer may be selected. By freely varying the combination of the nickel plating layer and the chromium plating layer, it is possible to obtain a mark having superior conspicuity and design.

Also, a vacuum plating layer of titanium nitride or zirconium nitride may be formed on the plural plating layers by a PVD method. As a result of this, gold color, gray color, brown color, or various other colors can be obtained, and thereby the possible variations of the design are increased.

When laser marking is conducted to the surface of the plating layers having the above-mentioned combination, taking the inequality of the depth of the laser marking processing into consideration, the thickness of the upper plating (for example, chromium plating) layer is preferably around 0.01 to 2 μm and the thickness of the lower plating (for example, chromium plating) layer is preferably around 5 μm or more, so as to obtain conspicuity and corrosion resistance of the mark. The depth of the laser marking processing is targeted for the amount which is total of the thickness of the upper plating (for example, chromium plating) layer and around 2 to 3 μm of the lower plating (for example, nickel plating) layer. As a result of this, even if the processing is partly too deep because of the processing inequalities, the depth of the laser marking processing can be limited to the minimum thickness 5 μm of the lower plating (for example, nickel plating) layer at most, and thereby the conspicuity and corrosion resistance can be obtained.

Also, in the case where a vacuum plating layer of titanium nitride or zirconium nitride is formed on the plural plating layers by a PVD method, the thickness of the vacuum plating layer is around 0.01 to 1 μm and this thickness is added to the depth of the laser marking processing.

Next, by applying a different kind of plating layer to the mark portion, it is possible to make the color of the mark portion different from that of the surface. Depending on the kind of the plating layer, it is possible to obtain various colors for the mark, for example, gold plating (gold color), silver plating (silver color), copper plating (pink color (in the early stage)), black nickel (black color), an alloy of tin and nickel (purplish color). The thickness of this plating layer is preferably around 0.01 to 2 μm. After the plating layer is applied, the surface is wiped with a hand or polished with airplane cloth, and thereby the mark is finished in which only the mark portion is colored.

For the coloring of the mark, it is possible to apply ink or paint to the mark portion. Depending on the object or use of the mark, the condition of the laser marking processing and the method of coloring are determined. If the laser marking is targeted for a deep depth, there is no need of masking. In this case, a concave portion having a depth of 0.1 to 1.0 mm is formed, and ink or paint is poured thereinto or brush painting is conducted. If the depth of a concave portion may be an arbitrary value and the thickness of coloring must be set at a desired value, a mask is used for coloring. In this case, if the coloring must be thickened, the thickness of the mask is increased, and pouring ink or paint or brush painting is selected. If the coloring is thinned, the thickness of the mask is decreased, and brush painting or solid printing is selected. In either case, the desired depth of a concave portion can be obtained by controlling the condition of the laser marking processing, the thickness of the coloring can be determined by controlling the thickness of the mask, and the combination can be freely selected depending on the object.

Since the coloring with ink or paint is the last process of the product processing, there is no limit of ink or paint and all colors can be used including not only white, black, blue, red or yellow, but also gold, silver, metallic colors, or the like. In addition, if processing is conducted for each color, it is possible to apply plural colors to a mark.

Preferred embodiments of the present invention will now be described. However, the present invention is not limited to the preferred embodiments. It is possible to make a broad range of modifications within the conception of the present invention.

EXAMPLE 1

Various kinds of plating were applied and laser marking processing was conducted to a spout being a part of a faucet product. The conspicuity and corrosion resistance were evaluated. As a mark design, a picture of a hand having an outside diameter Φ of 26 mm and a line width of 1 mm was used, which is shown in FIG. 1.

The material of the spout was a brass foundry product. After the surface thereof was polished, a nickel-chromium plating layer were applied to the surface. The target thickness of the nickel plating layer was 7.5 $\mu$m or more and that of the chromium plating layer was 0.5 $\mu$m or more. The actual thickness of the nickel plating layer was 8 to 10 $\mu$m or more and that of the chromium plating layer was 0.5 to 0.7 $\mu$m.

Figure 2:
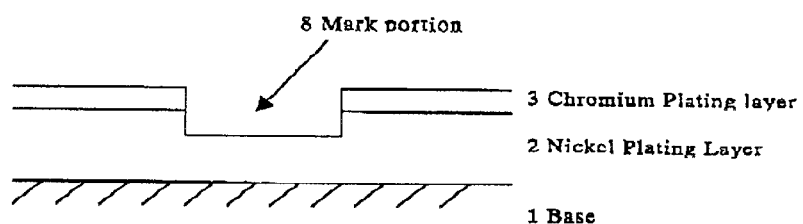
FIG. 2 is a cross-sectional view of the plating layers in the mark portion according to the first embodiment of the present invention.

Laser marking processing was conducted to the upper end surface of the plated spout to form the picture shown in FIG. 1. As a laser marking apparatus, YAG Laser Marker LAY-724CC-1AB manufactured by TOSHIBA CORPORATION was used. Q-SW was set at 2 KHz, while the current value was varied within the range of 12 to 18 A and the marking speed was varied within the range of 100 to 200 mm/S. The conspicuity, depth, and corrosion resistance of the mark obtained by the laser marking on each condition were evaluated. The result of each case was good. The cross section of the plating layers in the mark portion is shown in FIG. 2. With respect to the conspicuity, the mark having a yellowish and bright color was distinguished from the surface having a bluish and bright color, and thereby the mark could clearly be seen from any direction irrespective of light reflection. The depth of the mark was within the range of 2 to 4 $\mu$m at most, that is, within the thickness of the nickel plating layer, and the result of the CASS test (48 hours) with respect to the corrosion resistance showed no problem. Please note that the CASS (Copper-accelerated Acetic Acid Salt Spray) test is for evaluating the corrosion resistance of a nickel-chromium plating layer according to JIS (Japanese Industrial Standard) H 8617.

EXAMPLE 2

In this example, the combination of a nickel plating layer and a black chromium plating layer was used. The actual thickness of the nickel plating layer was 8 $\mu$m and that of the black chromium plating layer was 0.5 $\mu$m. Q-SW was set at 2 KHz, the current value was set at 14 A, and the marking speed was set at 200 mm/S. The conspicuity, depth, and corrosion resistance of the mark obtained by the laser marking with these conditions were evaluated. The result was good. With respect to the conspicuity, the mark having a yellowish and bright color was distinguished from the surface having a black and bright color, and thereby the mark could clearly be seen from any direction irrespective of light reflection. The depth of the mark was within the range of 2 to 4 $\mu$m at most, that is, within the thickness of the nickel plating layer, and the result of the CASS test (48 hours) with respect to the corrosion resistance showed no problem.

EXAMPLE 3

In this example, the combination of a nickel plating layer and a gold plating layer was used. The actual thickness of the nickel plating layer was 8 $\mu$m and that of the gold plating layer was 2 $\mu$m. Q-SW was set at 2 KHz, the current value was set at 14 A, and the marking speed was set at 200 mm/S. The conspicuity, depth, and corrosion resistance of the mark obtained by the laser marking with these conditions were evaluated. The result was good. With respect to the conspicuity, the mark having a yellowish and bright color was distinguished from the surface having a gold and bright color, and thereby the mark could clearly be seen from any direction irrespective of light reflection. The depth of the mark was within the range of 2 to 4 $\mu$m at most, that is, within the thickness of the nickel plating layer, and the result of the CASS test (48 hours) with respect to the corrosion resistance showed no problem.

EXAMPLE 4

Figure 3:
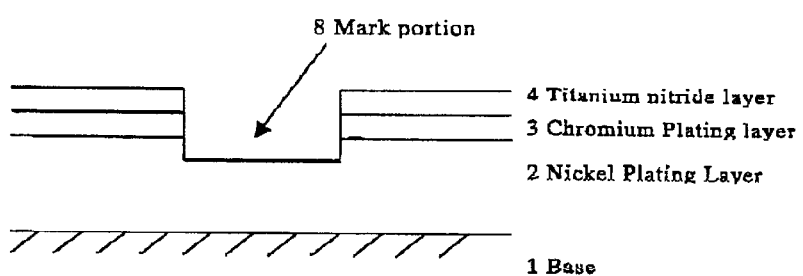
FIG. 3 is a cross-sectional view of the plating layers in the mark portion according to the fourth embodiment of the present invention.

In this example, the combination of a nickel plating layer, a chromium plating layer, and a titanium nitride layer which is formed thereon by ion plating was used. The actual thickness of the nickel plating layer was 8 $\mu$m, that of the gold plating layer was 2 $\mu$m, and that of the titanium nitride layer was 0.3 $\mu$m. Q-SW was set at 2 KHz, the current value was set at 14 A, and the marking speed was set at 200 mm/S. The conspicuity, depth, and corrosion resistance of the mark obtained by the laser marking on this condition were evaluated. The result was good. The cross section of the plating layers in the mark portion is shown in FIG. 3. With respect to the conspicuity, the mark having a yellowish and bright color was distinguished from the surface having a gold-like and bright color, and thereby the mark could clearly be seen from any direction irrespective of light reflection. The depth of the mark was within the range of 2 to 4 Mm at most, that is, within the thickness of the nickel plating layer, and the result of the CASS test (48 hours) with respect to the corrosion resistance showed no problem.

EXAMPLE 5

Plating was applied and laser marking processing was conducted to a spout being a part of a faucet product. Another kind of plating was applied to the mark portion which was obtained by the laser marking. The conspicuity and corrosion resistance were evaluated. As a mark design, a picture of a hand having an outside diameter Φ of 26 mm and a line width of 1 mm was used in the same manner as the above-mentioned examples, which is shown in FIG. 1.

Figure 4:
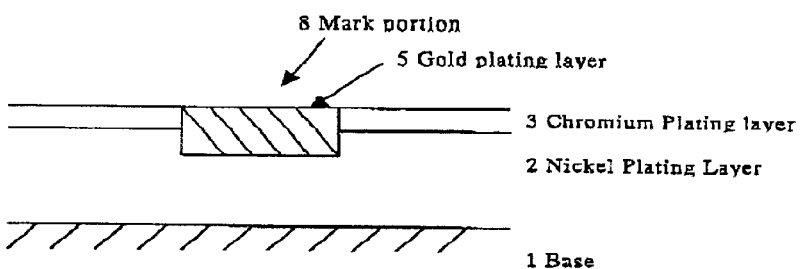
FIG. 4 is a cross-sectional view of the plating layers in the mark portion according to the fifth embodiment of the present invention.

Gold plating was applied to the mark portion of the product to which the laser marking processing was conducted as mentioned in Example 1. Specifically, after alkali and acid cleaning was conducted to the product as pretreatment, gold plating was conducted at a current value of 1 A/dm$^2$ and for 2 minutes. After the gold plating, by polishing the surface of the product with airplane cloth, the plating other than in the mark portion was removed, and thereby the spout having a gold mark was obtained. The conspicuity and corrosion resistance of the mark were evaluated. The result was good. With respect to the conspicuity, the mark having a haze gold color was distinguished from the surface having a bluish and bright color, and thereby the mark could clearly be seen from any direction irrespective of light reflection. With respect to the corrosion resistance, since the depth of the mark was within the thickness of the nickel plating layer, and also the gold plating layer was applied thereto, the result of the CASS test (48 hours) showed no problem. The cross section of the plating layers in the mark portion is shown in FIG. 4.

EXAMPLE 6

In this example, an alloy of tin and nickel was used for the plating layer applied to the mark portion. Plating was conducted at a current value of 0.2 A/dm$^2$ and for 2 minutes. After the plating, by polishing the surface of the product with airplane cloth, the plating other than in the mark portion was removed, and thereby the spout having a purplish mark was obtained. The conspicuity and corrosion resistance of the mark were evaluated. The result was good. With respect to the conspicuity, the mark having a haze purplish color was distinguished from the surface having a bluish and bright color, and thereby the mark could clearly be seen from any direction irrespective of light reflection. With respect to the corrosion resistance, since the depth of the mark was within the thickness of the nickel plating layer and also the plating layer of a tin-nickel alloy was applied thereto, the result of the CASS test (48 hours) showed no problem.

EXAMPLE 7

In this example, copper was used for the plating layer applied to the mark portion. Plating was conducted at a current value of 5 A/dm$^2$ and for 2 minutes. After the plating, by polishing the surface of the product with airplane cloth, the plating other than in the mark portion was removed, and thereby the spout having a pink mark was obtained. The conspicuity and corrosion resistance of the mark were evaluated. The result was good. With respect to the conspicuity, the mark having a pink color was distinguished from the surface having a bluish and bright color, and thereby the mark could clearly be seen from any direction irrespective of light reflection. With respect to the corrosion resistance, since the pink color in the early stage of the copper plating layer was turned into a brown color because of sequence variation, the mark was characterized by such a variation. By conducting clear coat treatment to the surface, it is possible to keep the color in the early stage.

EXAMPLE 8

Plating was applied and laser marking processing was conducted to a spout being a part of a faucet product. The mark portion which was obtained by the laser marking was colored with printing ink. The depth, adhesion, and abrasion resistance were evaluated. The material of the spout was a brass foundry product. After the surface thereof was polished, a nickel-chromium plating layer was applied to the surface. Polyester ink was used for the coloring and drying was conducted at 70° C. for 60 minutes after the coloring. As a mark design, a picture of a hand having an outside diameter Φ of 26 mm and a line width of 1 mm was used in the same manner as the above-mentioned examples, which is shown in FIG. 1.

Figure 5:
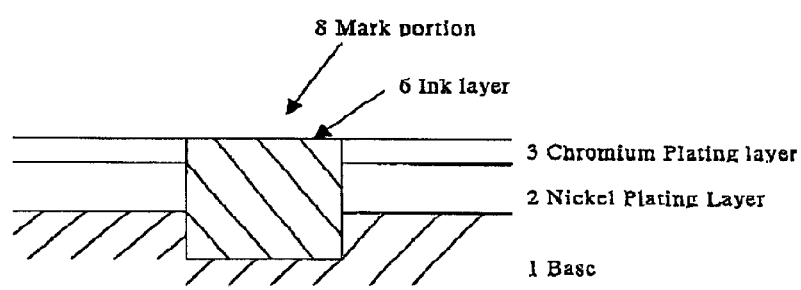
FIG. 5 is a cross-sectional view of the plating layers in the mark portion according to the eighth embodiment of the present invention.

Laser marking processing was conducted to the upper end surface of the plated spout to form the picture shown in FIG. 1. As a laser marking apparatus, YAG Laser Marker LAY-724CC-1AB manufactured by TOSHIBA CORPORATION was used. As laser marking conditions, Q-SW was set at 2 KHz, the current value was set at 18 A, the marking speed was set at 1000 mm/S, the width of the marking was 1 mm, and the pitch was 0.02 mm. After the laser marking, ink was poured and a mark was formed. The colored mark was examined. With respect to the depth, the mark had a concave portion of around 0.1 to 0.2 mm depth formed by the laser marking. Also, the results of evaluating the primary and secondary adhesion and the abrasion resistance showed no problems. The cross section of the plating layers in the mark portion is shown in FIG. 5.

EXAMPLE 9

Figure 6:
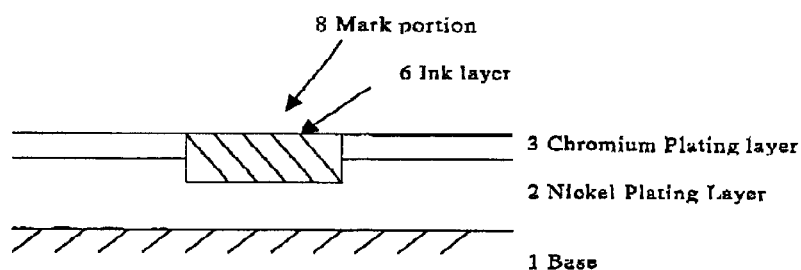
FIG. 6 is a cross-sectional view of the plating layers in the mark portion according to the ninth embodiment of the present invention.

In this example, some of the laser marking conditions in Example 8 were changed and also printing was used for the coloring method. As laser marking conditions, Q-SW was set at 2 KHz, the current value was set at 14 A, and the marking speed was set at 200 mm/S. Next, printing of a mark was conducted while adjusting a mark to be printed just to the marked portion which was obtained by the laser processing. The mark was examined. With respect to the depth, the mark had a concave portion of around 2 to 5 μm in depth which was formed by the laser marking. Also, the results of evaluating the primary and secondary adhesion showed no problems. The abrasion resistance was several times greater than the case of conducting printing without laser markings. The cross section of the plating layers in the mark portion is shown in FIG. 6.

EXAMPLE 10

Figure 7:
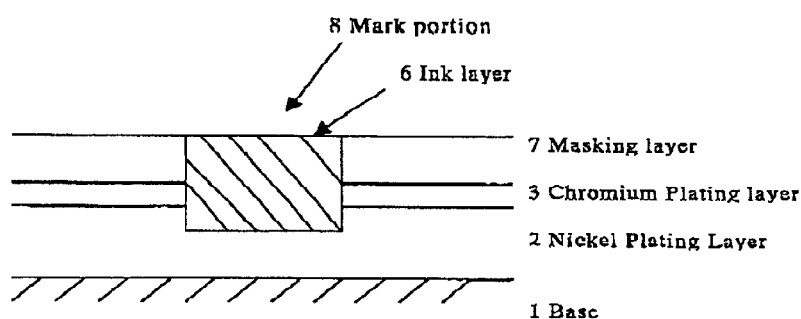
FIG. 7 is a cross-sectional view of the plating layers in the mark portion according to the tenth embodiment of the present invention.

In this example, some of the laser marking conditions in Example 8 were changed, and also a mask was added. As a mask, a sheet of vinyl chloride resin to which adhesive was applied was used and the thickness was 0.12 mm. As laser marking conditions, Q-SW was set at 2 KHz, the current value was set at 16 A, and the marking speed was set at 200 mm/S. Next, ink was poured into the marked portion which was obtained by the laser processing, and thereafter the mask was removed, so as to form a mark. The mark was examined. With respect to the depth, the mark had a concave portion having a bottom located around 2 to 5 $\mu$m from the surface of the base, the concave portion formed as a result of the laser marking penetrating the mask. Also, the results of evaluating the primary, secondary adhesion, and the abrasion resistance had no problems. The cross section of the plating layers in the mark portion is shown in FIG. 7.

EXAMPLE 11

In this example, the kind of a mask was changed, and also printing was used for the coloring method. As a mask, a tape of aluminum to which adhesive was applied was used and the thickness was 0.08 mm. Ass laser marking conditions, Q-SW was set at 2 KHz, the current value was set at 16 A, and the marking speed was set at 200 mm/S. Next, solid printing with ink was conducted, and thereafter the mask was removed, so as to form a mark. The mark was examined. With respect to the depth, the mark had a concave portion having a bottom located around 2 to 5 $\mu$m from the surface of the base, the concave portion formed as a result of the laser marking penetrating the mask. Also, the results of evaluating the primary, secondary adhesion, and the abrasion resistance were good in the same manner as Example 10.

EXAMPLE 12

In this example, alkali peeling type resist paint was used for the material of a mask, and also brush painting was used fox the coloring method. The mask material was applied to have a thickness of around 10 to 20 $\mu$m by brush painting. Laser marking was conducted under the conditions that Q-SW was 2 KHz, the current value was 16 A, and the marking speed was 200 mm/S. Next, ink was applied, and thereafter the mask was removed with an aqueous solution of 3% sodium hydroxide, so as to form a mark. The mark was examined. With respect to the depth, the mark had a concave portion having a bottom located around 2 to 5 $\mu$m from the surface of the base, the concave portion formed as a result of the laser marking penetrating the mask. Also, the results of evaluating the primary, secondary adhesion, and the abrasion resistance were good in the same manner as Example 10.

Comparative Example 1

In this comparative example, laser marking processing was conducted to the plated product of Example 1 under a different condition. That is, Q-SW was set at 2 KHz, the current value was set at 18 A, and the marking speed was set at 200 mm/S, while the frequency of the processing was changed from once to twice and three times. The conspicuity, depth, and corrosion resistance of the mark were evaluated. The mark obtained by laser marking two or three times had a problem with respect to the corrosion resistance. Specifically, the mark had a good conspicuity, however, the greatest depth of the mark was 13 to 32 $\mu$m in the case of the laser marking two or three times and exceeded the thickness of the nickel plating layer, while the greatest depth of the mark was 5 to 6 $\mu$m in the case of laser marking once and was within the thickness of the nickel plating layer. Therefore, the mark had a problem with respect to the corrosion resistance shown by a result of the CASS test (48 hours). The processing conditions and the results in Example 1 to 4 and Comparative Example 1 are shown in the following Table 1.

TABLE 1

| | Processing conditions | | | | | Greatest depth of mark ($\mu$m) Measured at four points | | | | |
|---|---|---|---|---|---|---|---|---|---|---|
| | Q-SW (KHz) | Current (A) | Marking Speed (mm/s) | Processing Frequency | Appearance Conspicuity | ① | ② | ③ | ④ | CASS test |
| Example 1 | 2 | 12 | 200 | 1 | ○ | 4 | — | — | 4 | ○ |
| | 2 | 14 | 200 | 1 | ○ | 2 | 2 | 2 | 3 | ○ |
| | 2 | 18 | 200 | 1 | ○ | 4 | — | — | 3 | ○ |
| | 2 | 14 | 100 | 1 | ○ | 4 | — | — | 4 | ○ |
| | 2 | 18 | 100 | 1 | ○ | 5 | — | — | 4 | ○ |
| Example 2 | 2 | 14 | 200 | 1 | ○ | 3 | — | — | 3 | ○ |
| Example 3 | 2 | 14 | 200 | 1 | ○ | 4 | — | — | 3 | ○ |
| Example 4 | 2 | 14 | 200 | 1 | ○ | 3 | — | — | 3 | ○ |
| | 2 | 18 | 70 | 1 | ○ | 6 | 5 | 6 | 6 | ○ |
| Comparative | 2 | 18 | 70 | 2 | ○ | 32 | 17 | 13 | 26 | X |
| Example 1 | 2 | 18 | 70 | 3 | ○ | 25 | 19 | 22 | 22 | X |

Comparative Example 2

In this comparative example, laser marking processing was conducted to the plated product of example 5 prior to conducting plating. As the laser marking conditions prior to conducting plating, Q-SW was set at 2 KHz, the current value was set at 18 A, the marking speed was set at 70 mm/S, ad the frequency of the processing was twice. The conspicuity, depth, and corrosion resistance of the mark were evaluated. Since the greatest depth of the mark was 13 to 32 μm, it was possible to manage to distinguish the mark by the brightness differences in the plating surface irregularities, however, the mark having the same color was not so conspicuous. The quality of the plating was good and thereby there was no problem with respect to the corrosion resistance.

Comparative Example 3

In this comparative example, laser marking processing was not conducted to the plated product of Example 8 and only printing was conducted. The thickness of the printing was around 5 to 10 μm. The mark had no problem with respect to the first adhesion, however, the mark was peeled with respect to the second adhesion. Also, there was a problem with respect to the abrasion resistance in that the mark was worn so as to be indistinguishable.

As mentioned above, according to the present invention, by conducting laser marking to the surface of a plating layer, applying another plating layer to the surface of the plating layers to which laser marking is conducted, or applying ink or paint to the surface of the plating layers to which laser marking is conduced, it is possible to easily form a colored mark having superior conspicuity, corrosion resistance, adhesion, abrasion resistance and design. It is also possible to apply the method to a product which needs a mark having a desired letter or picture.

What is claimed is:

1. A method for forming a mark comprising the steps of:
   forming a plating layers on a base;
   forming a mask on the surface of said plating layers;
   providing a concave portion or a concavo-convex portion on the surface of said plating layers by laser marking which penetrates the mask;
   applying a color thereto with ink or paint; and
   removing the mask;
   whereby a colored mark is obtained without bleeding of ink or paint.

2. A method for forming a mark according to claim 1, wherein the mask is formed by one of metal, resin, and paper, wherein the metal comprises one or more of aluminum, stainless steel, nickel, and silver, wherein the resin comprises one or more of vinyl chloride resin, polyester resin, and acrylic resin, and wherein the paper comprises one or more of Japanese paper and western paper.

3. A method for forming a mark according to claim 2, wherein the mask is made of the resin, and wherein the ink or paint is soluable with respect to an aqueous or alkali solution.

4. A method for forming a mark according to claim 1, wherein pouring of the ink or paint, printing of the same shape as the concave portion or concavo-convex portion, brush painting or solid printing is selected as the coloring method depending on the depth of the concave portion or concavo-convex portion.

5. A faucet product in which a mark having a desired letter or picture is formed by a method according to claim 1.

* * * * *